United States Patent [19]

Perry

[11] 4,339,673
[45] Jul. 13, 1982

[54] DRIVER CIRCUITS FOR AUTOMATIC DIGITAL TESTING APPARATUS

[75] Inventor: Graham A. Perry, Stockport, England

[73] Assignee: International Computers Limited, London, England

[21] Appl. No.: 129,637

[22] Filed: Mar. 12, 1980

[51] Int. Cl.³ .................. H03K 3/01; G01R 00/00
[52] U.S. Cl. .................. 307/270; 307/296 R; 307/475; 324/158 T
[58] Field of Search .............. 324/158 T; 307/270, 307/296 R, 475

[56] References Cited

U.S. PATENT DOCUMENTS 3,769,522 10/1973 Abbott .................. 307/475
3,986,045 10/1976 Lutz .................. 307/475

Primary Examiner—Harold A. Dixon
Attorney, Agent, or Firm—Hane, Roberts, Spiecens & Cohen

[57] ABSTRACT

A driver circuit for use in testing either ECL (emitter-coupled logic) or TTL (transistor-transistor logic) devices. The circuit has a pair of variable reference voltages ($V_H, V_L$) for determining the logic levels 0 and 1. The circuit also has two termination networks (8,9) for ECL and TTL, which are selectively connected to the output of the driver circuit according to the value of one of the reference voltages ($V_L$). Preferably the circuit is formed as a hybrid network in which transistors from the same semiconductor slice are mounted on the same ceramic substrate.

8 Claims, 5 Drawing Figures

DRIVER CIRCUITS FOR AUTOMATIC DIGITAL TESTING APPARATUS

BACKGROUND OF THE INVENTION

This invention relates to driver circuits for automatic digital testing apparatus.

One known form of digital test apparatus comprises a plurality of driver circuits which, in use, are connected to respective terminals of the equipment under test, so as to permit test signals to be injected into the equipment. Some of the terminals may alternatively be used to receive response signals from the equipment under test, for comparison with the expected responses.

The equipment under test may be of a variety of different types. For example it may comprise ECL (emitter-coupled logic) or TTL (transistor-transistor logic) circuits. Different types of logic circuit generally use different voltage levels to represent the binary digits "0" and "1". Moreover, different types of logic generally also require different matching networks to be connected to terminals which receive response signals from the equipment under test.

In the past, these requirements have meant that different driver circuits have had to be provided for different types of logic. This is very expensive. The object of the present invention is therefore to provide a driver circuit which is capable of being used with more than one type of equipment.

SUMMARY OF THE INVENTION

According to the invention, a driver circuit for automatic digital testing apparatus comprises a switching circuit arranged to produce a binary output signal at an output terminal, the signal having two levels representing the binary digits 0 and 1, the levels being determined by two variable reference voltages, characterised by at least two matching circuits containing different matching networks, and a matching control circuit responsive to one of the reference voltages, for connecting one or other of the matching circuits to the output terminal in accordance with the magnitude of that reference voltage.

Thus, the matching circuit is selected automatically in accordance with the type of logic under test, as specified by the reference voltage.

BRIEF DESCRIPTION OF THE DRAWINGS

One driver circuit in accordance with the invention will now be described by way of example with reference to the accompanying drawings of which

DESCRIPTION OF THE PREFERRED EMBODIMENT

Figure 1:
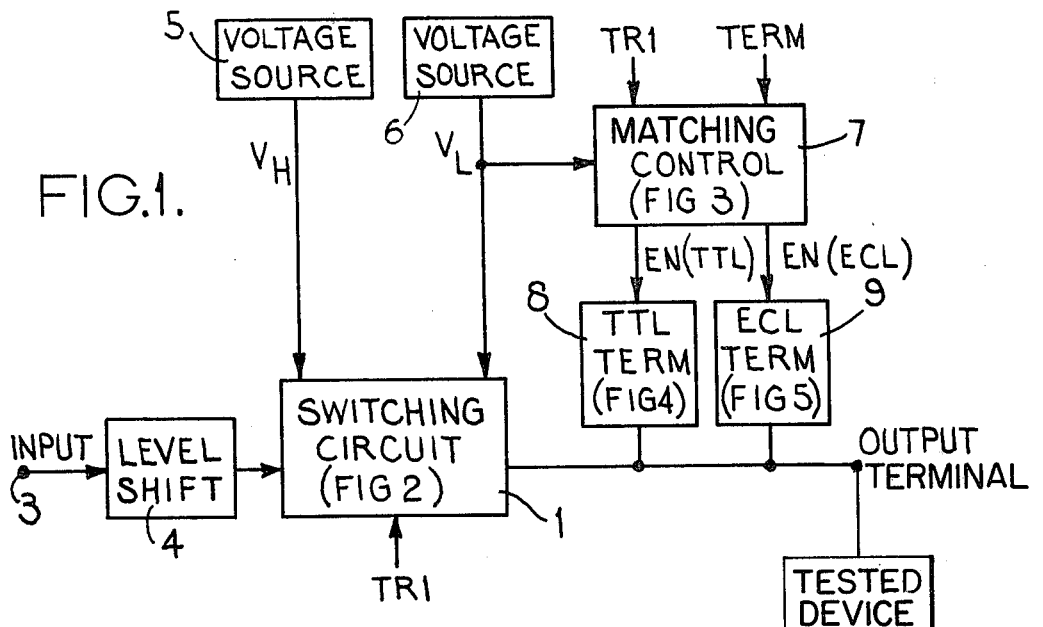
FIG. 1 is an overall block diagram of the circuit.

Referring to FIG. 1, the driver circuit comprises a switching circuit 1 which produces output signals at an output terminal 2. In use, this terminal is connected to a terminal of the equipment under test (not shown).

The switching circuit is controlled by input binary signals at an input terminal 3. These input signals may, for example, be generated by a digital computer. The input signals are fed to the switching circuit 1 by way of a level shifting circuit 4, and cause the switching circuit to be switched into a first or second state according to whether the input signal represents "0" or "1".

The voltage levels of the output of the switching circuit are accurately controlled by two reference voltages $V_H$ and $V_L$ from external variable voltage sources 5 and 6. When the switching circuit is in its first state (corresponding to input value "0"), the output assumes the lower voltage level $V_L$. When the switching circuit is in its second state (corresponding to input "1"), the output assumes the higher voltage level $V_H$. The two reference voltages $V_H$ and $V_L$ may be adjusted within the range $-2$ volts to $+4$ volts. This permits the driver circuit to be adjusted for testing either TTL or ECL equipment as follows:

|     | $V_L$      | $V_H$      |
| --- | ---------- | ---------- |
| TTL | 0 volts    | +4 volts   |
| ECL | −1.8 volts | −0.8 volts |

Instead of injecting a signal into the equipment under test, it may be desired to receive a response signal from the equipment and to compare it (by means of a comparator, not shown) with the expected response. For this purpose, the switching circuit 1 can be put into a "tristate" condition, by means of a control signal TRI. In this condition, the voltage at the output terminal 2 is not affected by changes of the input signal, but is determined solely by the level of the response signal from the equipment under test.

The tristate control signal TRI is also applied to a matching control circuit 7, causing it to produce one of two signals EN(TTL and EN(ECL) which respectively enable a TTL matching circuit 8 or an ECL terminator circuit 9. Which of these two circuits is enabled depends on the magnitude of the lower reference voltage $V_L$: when $V_L=0$ volts (the TTL lower logic level), the TTL matching circuit 8 is enabled, and when $V_L=-1.8$ volts (the ECL lower logic level), the ECL matching circuit 9 is enabled.

The matching control circuit 7 can be inhibited, by means of a control signal TERM, and when it is inhibited neither of the matching circuits 8, 9 is enabled.

Figure 2:
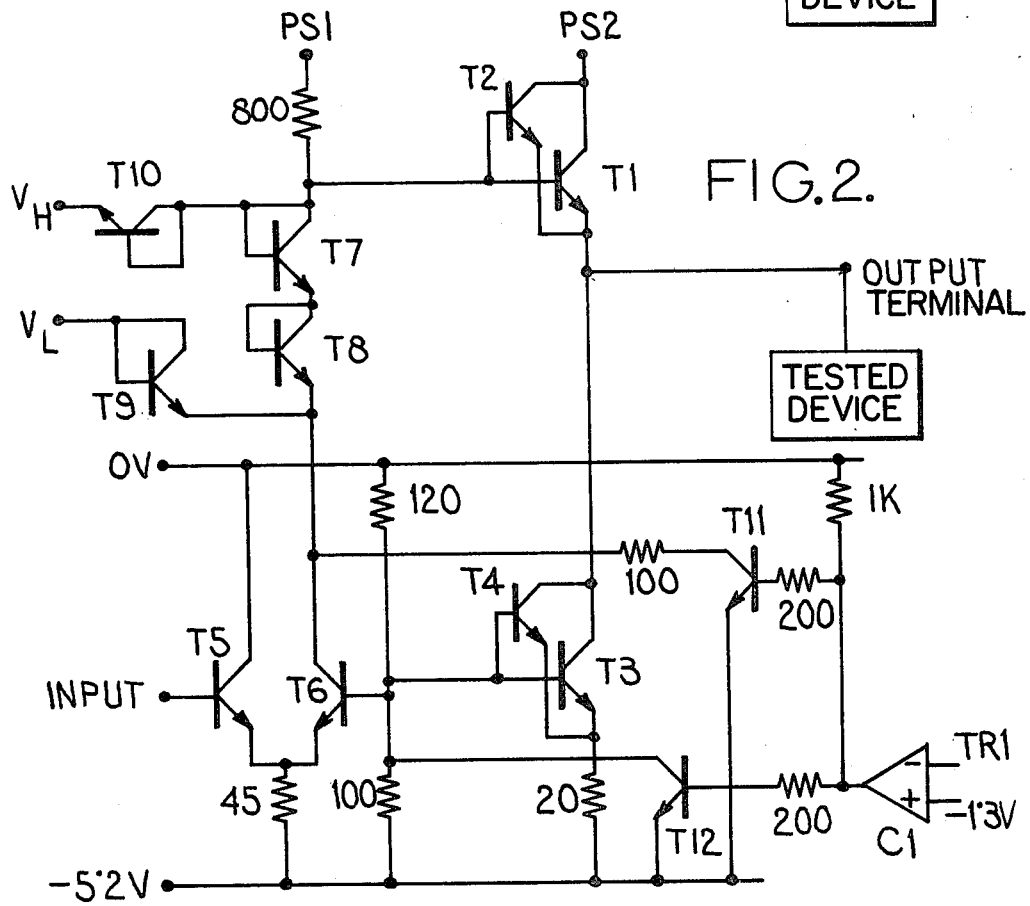
FIG. 2 shows the switching circuit in more detail.

Referring now to FIG. 2, this shows the switching circuit 1 in more detail. The output voltage of the switching circuit is produced by an output stage consisting of a first pair of parallel-connected transistors T1 and T2, connected in series with a second pair of parallel-connected transistors T3, T4 between a power supply PS2 and a $-5.2$ volt supply. The input signal from the level shifter 4 (FIG. 1) is applied to a pair of switching transistors T5, T6, arranged as a differential amplifier.

When the input signal is low, T5 is switched off, and T6 is switched on. In this state, current flows from a power supply PS1, through transistors T7 and T8 (connected as diodes), and through transistor T6, to the $-5.2$ volt supply. Current also flows from the $V_L$ reference supply, through a transistor T9 (connected as a diode) and through the transistor T6. In this state, therefore, the voltage at the terminal 2 is $$V_L - V_{j}9 + V_{j}8 + V_{j}7 - V_{j}1$$

Where $V_{j}9$ is the voltage drop across the junction of transistor T9, and so on. If all the transistors are accurately matched, the voltage drops across their junctions will all be equal, i.e.

$$V_J9 = V_J8 = V_J7 = V_J1.$$

The voltage drops across the transistors will therefore cancel each other out, and the voltage at output terminal 2 will equal $V_L$.

When the input signal from the level shifter 4 is high, transistor T6 is switched off. Current therefore now flows from the power supply PS1 through a transistor T10 (connected as a diode) to the higher reference voltage $V_H$. The voltage at the output terminal is therefore equal to $$V_H + V_J10 - V_J1$$

which is simply equal to $V_H$ if the transistors are accurately matched.

As shown in FIG. 2, the tristate control signal TRI is applied to one input of a comparator C1, the other input of which is connected to an internally generated $-1.3$ volt supply. The signal TRI has two significant levels, $-0.8$ and $-1.8$ volts. When TRI$=-0.8$ volts, the output from the comparator C1 is negative, and has no effect on the switching circuit. However, when TRI$=-1.8$ volts, the output of the comparator C1 becomes positive, and this causes two transistors T11 and T12 to become saturated. Saturation of T11 causes the switching transistor T6 to be turned off, while saturation of T12 causes the output transistors T3, T4 to be turned off. The result is to put the switching circuit in the desired tristate condition.

Figure 3:
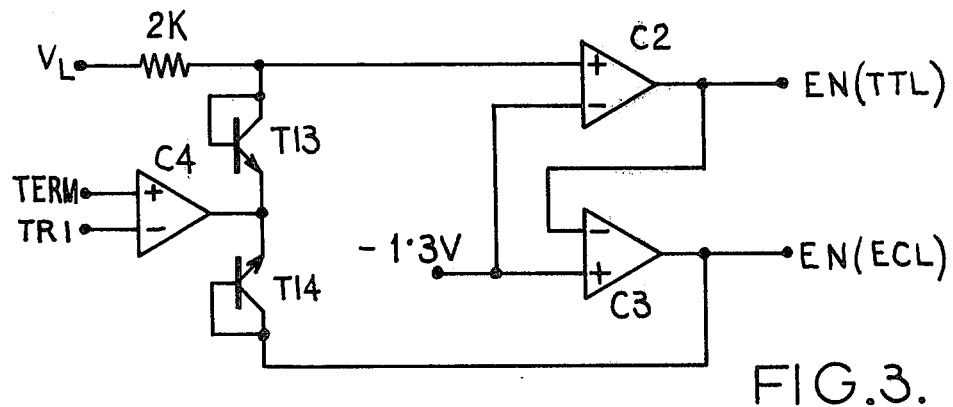
FIG. 3 shows the matching control circuit in more detail.

Referring now to FIG. 3, the termination control circuit comprises three comparators C2-C4. The positive input of C2 receives the reference voltage $V_L$ and compares it with a D.C. threshold level of $-1.3$ v. If $V_L$ is greater than $-1.3$ v, the output of C2 rises to $+0.8$ v, while if $V_L$ is less than $-1.3$ v, the output of C2 drops to $-5$ v. The output of C2 provides the control signal EN(TTL) which, when positive, enables the TTL matching circuit 8.

The output of C2 is also applied to the negative input of C3 where it is compared with the $-1.3$ v threshold level. Thus, when the output of C2 rises to $+0.8$ v, the output of C3 goes negative, and when the output of C2 drops to $-5$ v. the output of C3 goes positive. The output of C3 is therefore, in effect, the logical inverse of the output of C2, and provides the control signal EN(ECL) which, when positive, enables the ECL matching circuit 9.

In summary, it can be seen that when $V_L=0$ v, EN(TTL) goes positive and the TTL matching circuit 8 is enabled, and when $V_L=-1.8$ v, EN(ECL) goes positive and the ECL matching circuit 9 is enabled.

The operation of the comparators C2, C3 as described above can be overridden by the comparator C4. When the output of C4 goes negative, two transistors T13, T14, connected as diodes, become forward biased. T13 pulls the positive input voltage to C2 down to $-5$ v, while T14 pulls the output of C3 down to 5 v. The effect is therefore to force both the signals EN(TTL) and EN(ECL) to negative values, disabling both the matching circuits.

The comparator C4 receives the control signals TERM and TRI at its positive and negative inputs respectively. Normally, TERM is permanently wired to the internally generated $-1.3$ v. DC supply. Hence, the output of C4 is determined by the state of the TRI signal. However, when it is desired to inhibit both the matching circuits, TERM is connected to a $-5.2$ v. supply. In this case, the output of C4 is held at $-5$ v, irrespective of the value of TRI.

Figures 4, 5:
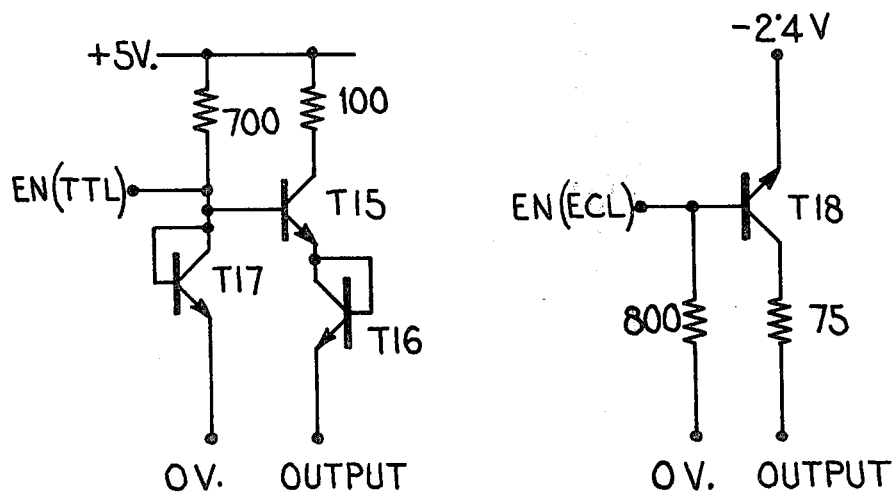
FIGS. 4 and 5 show TTL and ECL matching circuits respectively.

FIG. 4 shows the TTL matching circuit 8. It consists of a switching transistor T15 and another transistor T16 connected as a diode, so as to prevent undershoot of the signal from the equipment under test, without causing any DC loading on the equipment.

FIG. 5 shown the ECL matching circuit 9. It consists of a 75ohm resistor which is switched to a $-2.4$ v supply by means of a transistor T16.

In the driver circuit described above, it is required that the output signals should be similar to those that the equipment under test would encounter in actual operation. In particular, where the equipment under test consists of high speed circuitry, the rise and fall times of the signals should be very small, typically of the order of a few nanoseconds.

Moreover, it is desirable that the circuit should be physically small, since a typical test apparatus normally contains a large number of driver circuits.

To meet these requirements, the circuit is preferably implemented as a hybrid network, consisting of a plurality of integrated circuit chips mounted directly on a ceramic substrate and connected by conductive tracks on the substrate. Preferably, all the chips forming the transistors are fabricated from the same area of a single silicon slice. This ensures that the characteristics of the transistors are accurately matched, as described above. Moreover, since the chips are mounted on the same ceramic substrate, they are all held within a small temperature range, so that there is little temperature variation of their characteristics.

I claim:

1. A driver circuit for automatic digital testing apparatus, comprising a switching circuit; a first signal input terminal by which a control signal may be applied to the switching circuit to cause the latter to adopt a related switching state, the switching circuit having a line terminating at a terminal for connection to the circuit to be tested; second and third signal input terminals to the switching circuit, first voltage producing means for producing a first variable reference voltage connected with the second input; second voltage producing means for producing a second variable reference voltage connected with the third input; first and second circuit to be tested matching circuits having different operational characteristics, a matching circuit control unit connected to control operation of the first and second matching circuits, said control unit being responsive to one of the reference voltages for connecting one or the other of the matching circuits to the output terminal in accordance with the magnitude of that reference voltage, said switching circuit being such as to produce at the output terminal a binary output signal having two levels representing the binary digits 0 and 1, the levels being determined respectively by the two reference voltage levels.

2. A driver circuit as claimed in claim 1, and in which the switching circuit includes voltage paths between the output terminal and the second and third input terminals, each including a plurality of transistors which are so arranged that, in operation, the voltage drops across the junctions cancel out so that the voltage at the output terminal is substantially equal to one or the other of the first and second reference voltages.

3. A driver circuit as claimed in claim 2, in which the switching circuit transistors are fabricated from the same area of a single silicon chip whereby the characteristics of the transistors are accurately matched.

4. A driver circuit as claimed in claim 3, and including a ceramic substrate upon which the transistors are mounted whereby during operation the material of the substrate acts as a heat sink for the transistors.

5. A driver circuit as claimed in claim 1 or 2 in which the first and second voltage producing means include voltage adjustment arrangements which enable adjustments of the first and second voltage levels within the range −2 volts to +4 volts.

6. A driver circuit as claimed in claim 1 and 2, wherein the first and second matching circuits contain circuit arrangements respectively suitable for matching of ECL and TTL devices.

7. A driver circuit as claimed in claim 1, in which the switching circuit includes a ceramic substrate; a plurality of integrated circuit chips mounted on the substrate, and conductive tracks on the substrate interconnecting the integrated circuit chips into a hybrid network.

8. A driver circuit as claimed in claim 1, and further including means for placing the switching circuit in a condition in which the voltage at the output terminal is independent of the first and second reference voltages, and is determined solely by external voltage received by the terminal.

* * * * *

UNITED STATES PATENT AND TRADEMARK OFFICE
CERTIFICATE OF CORRECTION

PATENT NO. : 4,339,673
DATED : July 13, 1982
INVENTOR(S) : Graham A. Perry

It is certified that error appears in the above—identified patent and that said Letters Patent is hereby corrected as shown below:

-- Foreign Application Priority Data

Mar. 13, 1979   (GB) United Kingdom...08827/79 --.

*Signed and Sealed this*

*Thirty-first* Day of *August 1982*

[SEAL]

*Attest:*

*Attesting Officer*

GERALD J. MOSSINGHOFF
*Commissioner of Patents and Trademarks*